(12) United States Patent
McLaury

(10) Patent No.: US 7,512,015 B1
(45) Date of Patent: Mar. 31, 2009

(54) NEGATIVE VOLTAGE BLOCKING FOR EMBEDDED MEMORIES

(75) Inventor: Loren L. McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 239 days.

(21) Appl. No.: 11/487,751

(22) Filed: Jul. 17, 2006

(51) Int. Cl.
*G11C 11/34* (2006.01)

(52) U.S. Cl. .......................... 365/185.29; 365/185.11; 365/185.14

(58) Field of Classification Search ............ 365/189.01, 365/232, 185.29, 185.23, 185.33, 185.22, 365/185.27, 230.02, 230.06
See application file for complete search history.

(56) References Cited

U.S. PATENT DOCUMENTS

| | | | |
|---|---|---|---|
| 5,185,718 A | 2/1993 | Rinerson et al. | |
| 5,349,558 A | 9/1994 | Cleveland et al. | |
| 5,357,475 A | 10/1994 | Hasbun et al. | |
| 6,084,798 A | 7/2000 | Lee | |
| 6,662,263 B1 | 12/2003 | Wong | |
| 6,807,103 B2 | 10/2004 | Cavaleri et al. | |
| 6,909,641 B2 | 6/2005 | Naso et al. | |
| 6,965,526 B2 | 11/2005 | Cavaleri et al. | |
| 2001/0033515 A1* | 10/2001 | Tanzawa | 365/189.11 |
| 2002/0067639 A1* | 6/2002 | Byeon et al. | 365/185.11 |
| 2004/0208063 A1* | 10/2004 | Micheloni et al. | 365/185.29 |
| 2006/0044877 A1* | 3/2006 | Kato | 365/185.29 |

OTHER PUBLICATIONS

Cappelletti et al., Flash Memories, 1999, pp. 241-257.
U.S. Appl. No. 11/487,647, Loren McLaury.

* cited by examiner

*Primary Examiner*—Dang T Nguyen
(74) *Attorney, Agent, or Firm*—MacPherson Kwok Chen & Heid LLP; Jonathan W. Hallman

(57) ABSTRACT

In one embodiment, a memory is provided that includes: a memory cell array adapted to be programmed with a positive voltage from a positive-negative node and to be erased with a negative voltage from the positive-negative node; a negative voltage blocking circuit; and a positive voltage source operable coupled to the negative voltage blocking circuit, the positive voltage source operable to provide the positive voltage to the positive-negative node through the negative voltage blocking circuit, wherein the negative voltage blocking circuit is adapted to prevent the negative voltage from coupling from the positive-negative node to the positive voltage source.

19 Claims, 4 Drawing Sheets

NEGATIVE VOLTAGE BLOCKING FOR EMBEDDED MEMORIES

TECHNICAL FIELD

The present invention relates generally to memory circuits, more particularly, to a negative voltage blocking circuit for preventing the propagation of negative potentials within a memory circuit.

BACKGROUND

Programmable logic devices such as field programmable gate arrays (FPGAs) are typically configured by a user using a configuration bitstream that is stored in a configuration memory. This configuration memory may be either a non-volatile memory such as FLASH or a volatile memory such as SRAM. For a variety of reasons such as speed, SRAM-based FPGAs currently dominate the programmable logic device market. However, FPGAs have been developed which include embedded SRAM and FLASH memories. Such FPGAs enjoy the speed advantage of SRAM yet retain their configuaion upon power-down. Thus, the incorporation of embedded FLASH memories into FPGAs is a growing trend.

The integration of FLASH memory into a programmable logic device introduces a number of complications. Programming or erasing FLASH involves the use of relatively large voltages that would destroy the logic core of a programmable logic device such as an FPGA. Various adaptations have been developed to facilitate the handling of the relatively large voltages within FLASH memories. In particular, FLASH memories are commonly formed using a "triple p well" construction. A triple p-well 100 is illustrated in FIG. 1. During erasure of a FLASH memory cell, relatively large negative voltages such as $-10$ V may be transmitted through transistors such as an NMOS transistor 105. Should an n+ doped source of transistor 105 be brought that low on a grounded p-type substrate, a forward-biased p-n junction would result such that the source would clamp at approximately $-0.7$ V. To allow normal transistor operation in the presence of such a large negative voltage, transistor 105 is formed in an inner p-well 110 that in turn is formed in an n-well 115 formed in a p-type substrate 120. In this fashion, inner p-well 110 may be brought negative through a p-well bias applied to a p+ doped contact 125. For example, if negative 10 V is applied to the drain of the NMOS transistor, $-10$ V may also be applied to contact 125. Because n-well 115 may be grounded through an N-well bias at an n+ doped contact 130, no forward-biased p-n junctions result. Thus, the $-10$ V potential may flow through transistor 105 in a normal fashion. The term "triple" well arises because the substrate may be considered a first well, then n-well a second well, and the inner p-well a third well.

Although the use of a triple p-well allows the propagation of negative voltages in FLASH memories and other applications, the triple p well demands considerable die space. Accordingly, there is a need in the art for denser memories that accommodate negative voltages.

SUMMARY

In accordance with an aspect of the invention, a memory is provided that includes: a memory cell array adapted to be programmed with a positive voltage from a positive-negative node and to be erased with a negative voltage from the positive-negative node; a negative voltage blocking circuit; and a positive voltage source coupled to the negative voltage blocking circuit, the positive voltage source operable to provide the positive voltage to the positive-negative node through the negative voltage blocking circuit, wherein the negative voltage blocking circuit is adapted to prevent the negative voltage from coupling from the positive-negative node to the positive voltage source.

In accordance with another aspect of the invention, a method of operating an array of memory cells is provided that includes the acts of: driving a first set of cells within the array with a negative voltage, wherein the negative voltage couples from a negative voltage source through a positive-negative node to the first set of cells; driving a second set of cells within the array with a positive voltage, wherein the positive voltage couples from a positive voltage source through the positive-negative node to the second set of cells; and blocking the negative voltage from coupling to the positive voltage source while the first set of cells are driven with the negative voltage.

In accordance with another aspect of the invention, a programmable logic device is provided that includes: a logic core; a non-volatile memory for holding configuration data for the logic core; a positive voltage source operable to program the non-volatile memory with a positive voltage; a negative voltage source operable to erase the non-volatile memory with a negative voltage; and a blocking circuit operable to couple the positive voltage from the positive voltage source to the non-volatile memory and to isolate the positive voltage source from the negative voltage.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will not be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances,. well-known structures and principles of operation have not been described in detail to avoid obscuring the invention.

Figure 2:
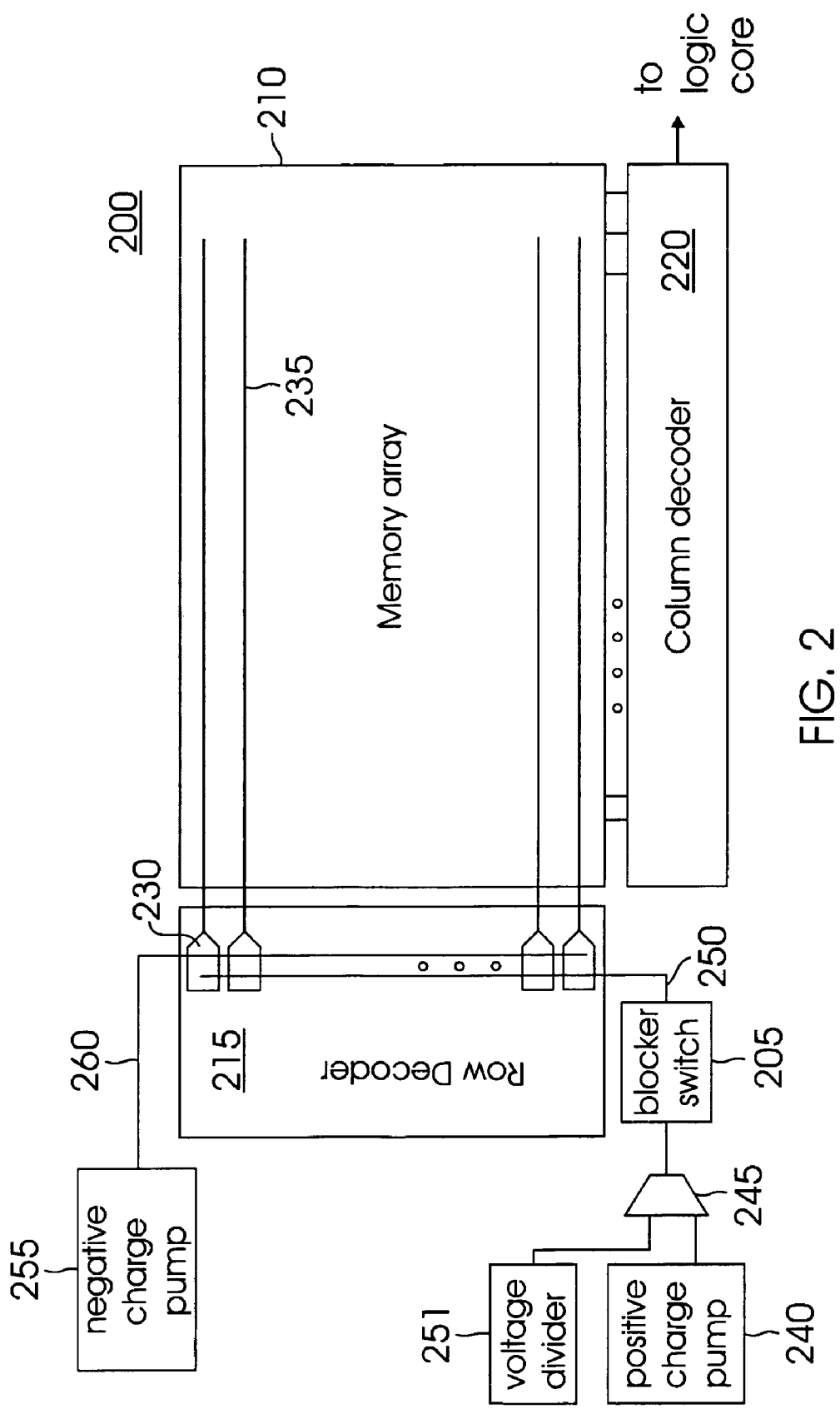
FIG. 2 is a block diagram of a FLASH memory including a negative voltage blocking circuit in accordance with an embodiment of the invention.

Turning now to FIG. 2, an examplary embedded FLASH memory 200 having a negative voltage blocking circuit 205 is illustrated. An array of memory cells 210 is addressed by a row decoder 215 and a column decoder 220. The FLASH memory may be embedded in a programmable logic device such that it stores configuration data. Configuration data retrieved from the FLASH memory flows through the column decoder to a logic core (not illustrated) for the programmable logic device. The row decoder includes row line drivers 230 that control the voltage of row (word) lines 235 coupling across the memory cell array. To program a row of memory cells, the corresponding row line is brought high (for example, 10 V) through operation of a positive charge pump 240. The positive charge pump couples through a voltage multiplexer 245 to the negative voltage blocking circuit so as to positively charge a positive-negative driver lead 250. In turn, the positive voltage on lead 250 couples through the selected row driver to the appropriate row line. Because a variety of positive voltages are often necessary in a FLASH memory for various programming modes, the positive charge pump couples to a voltage divider 251 that also couples to the voltage multiplexer. In this fashion, the positive-negative driver 250 may be charged to a variety of positive voltages such as 5, 8, or 10 volts depending upon the operating mode of the FLASH memory.

A similar operation occurs to erase a row of memory cells. The erasure requires a negative voltage (for example, −10 V) supplied by a negative charge pump 255 to negatively charge a negative driver lead 260. The negative voltage on the negative driver then couples through the selected row driver to the appropriate row line. Because of the negative voltages, the negative charge pump, the row drivers, and the memory array should all be located in a triple p-well (not illustrated) as discussed previously. But note that in a conventional row driver, driver leads 250 and 260 are electrically connected during an erase operation and act as a common node. Thus, positive-negative driver lead 250 is pulled negative as a row line is pulled negative. For this reason, lead 250 is designated as the "positive-negative" driver lead in that it will be pulled both positive and negative depending upon whether a programming or an erasure operation is occurring. Because the positive-negative driver lead is pulled to a negative voltage such as −10 V during an erasure operation, blocking circuit 205 prevents the negative voltage on this lead from propagating to the output from the voltage multiplexer. In this fashion, the voltage multiplexer, the voltage divider and the positive charge pump need not be formed in the triple p-well. In contrast, these components are typically formed in the triple p-well in a conventional FLASH memory that does not have the negative blocker circuit. Such a location for the positive voltage components demands considerable die space. By enabling a design in which the positive voltage components may be formed outside the triple p-well, the use of the negative voltage blocking circuit enhances density.

Figure 3:
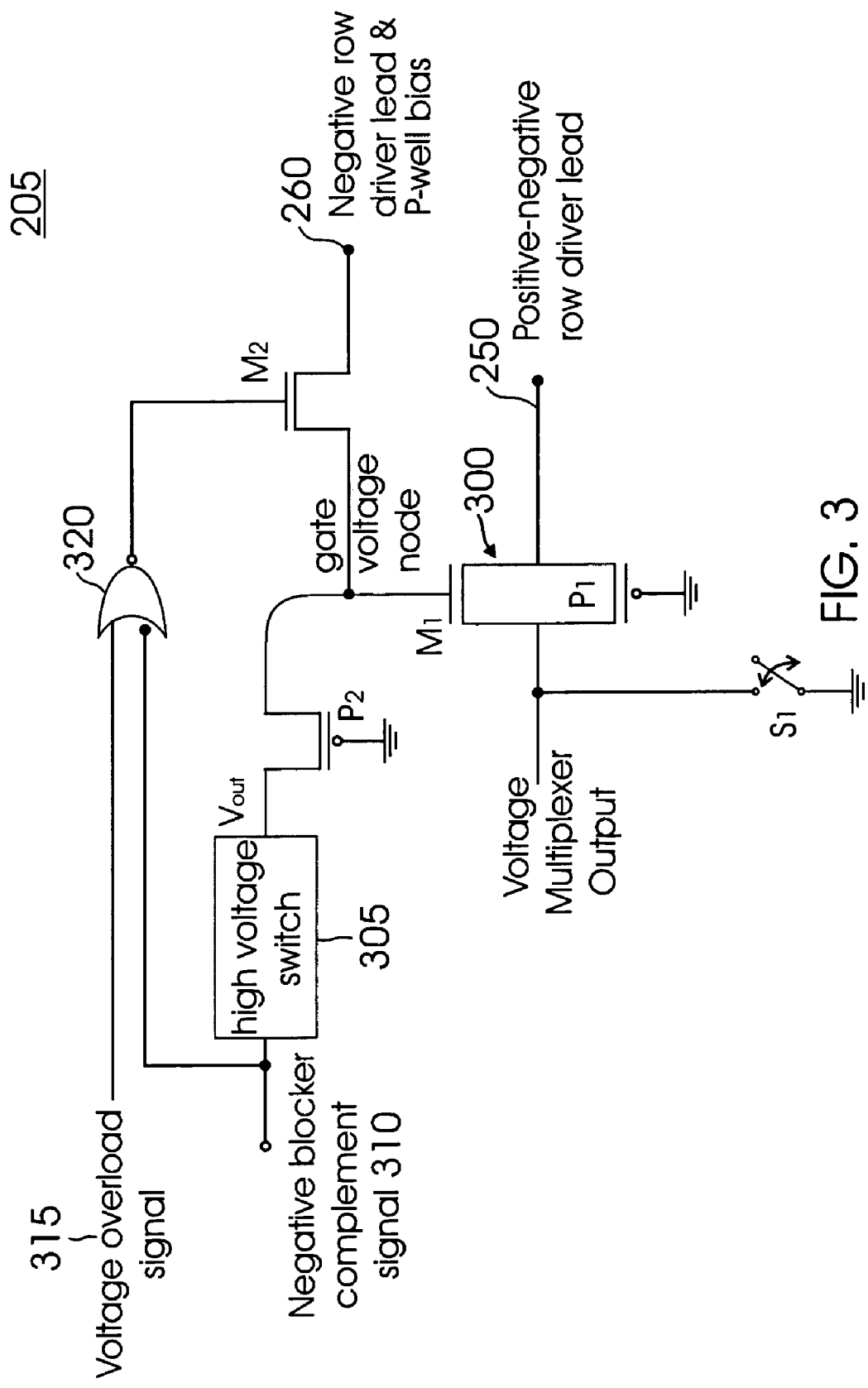
FIG. 3 is a circuit diagram for a negative voltage blocking circuit in accordance with an embodiment of the invention.

It will be appreciated that the negative voltage blocking circuit may be constructed many different ways. A circuit diagram for an examplary negative voltage blocking circuit 205 is illustrated in FIG. 3. A transmission gate 300 isolates the voltage multiplexer output from positive-negative driver lead 250. The transmission gate includes an NMOS transistor M1 and a PMOS transistor P1. During an erase operation, both the negative and the positive-negative row driver leads are charged to a negative voltage. The voltage multiplexer output is then grounded through operation of, for example, a switch S1. The gate of P1 is also grounded. Because the voltage multiplexer output acts as the source for P1, the source-to-gate voltage is thus zero volts for P1 such that P1 is not conducting. In an alterative embodiment, the gate of P1 may be switched rather than the voltage multiplexer output.

Figure 1:
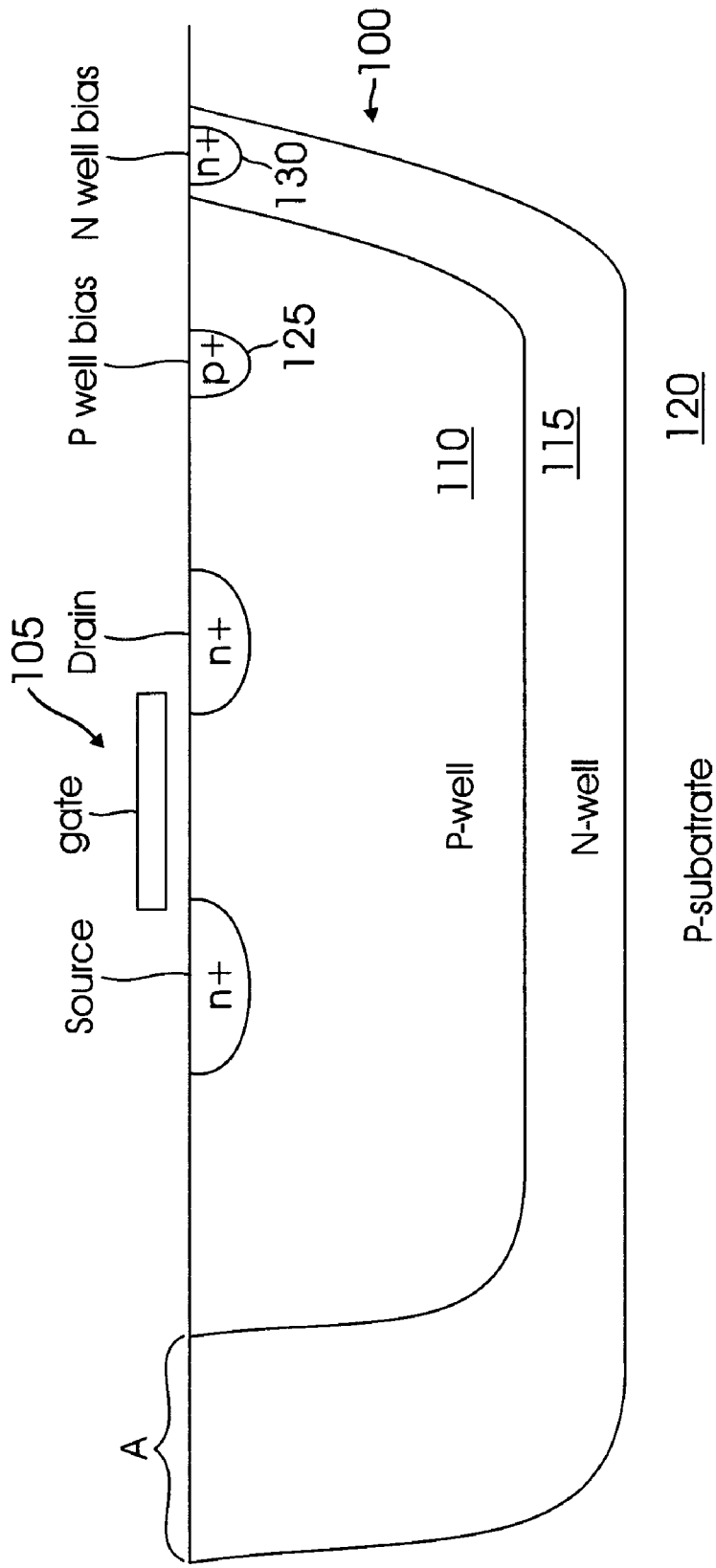
FIG. 1 is a block diagram of an embedded FLASH memory having a negative voltage blocking circuit in accordance with an embodiment of the invention.

The NMOS transistor M1 has its source coupled to the positive-negative row driver lead. Transistor M1 is located in the triple p-well discussed with regard to FIG. 1. Referring back to FIG. 1, the p-well bias is tied to the negative row driver lead so that inner p-well 110 is brought negative with the negative row driver lead. In this fashion, a forward-biased p-n junction does not result between the source of M1 and the p-well. The negative potential on the negative row driver lead couples through an NMOS transistor M2 to bring the gate voltage of M1 negative. N-well 115 of the triple p-well (also discussed with regard to FIG. 1) is grounded while the inner p-well is brought negative. To save die space, the PMOS transistor P1 may be located in an extension of the n-well (denoted as region A in FIG. 1). In this fashion, the same n-well bias affects both transistors M1 and P1.

During programming events requiring positive voltages, transistor M1 has its gate voltage brought high through operation of a high voltage switch 305. To prevent the possibility of contention between the negative row driver lead and the high voltage switch, the gate voltage node couples to the high voltage switch through a PMOS transistor P2. The high voltage switch responds to a negative blocker complement signal 310 that goes low during the erase operation by grounding an output voltage Vout. An overload protection signal 315 also goes low during an erase operation. Both signals 310 and 315 are received at a NOR gate 320 having an output that controls the gate of transistor M2. Thus, transistor M2 turns on if both signals 310 and 315 are low. As transistor M2 turns on, it couples the negative voltage on the negative row driver lead to the gate voltage node so that M1 stays off (having a gate-to-source voltage of 0.0 V) during the erase operation. Because both M1 and P1 do not conduct during the erase operation, the negative voltage on the positive-negative row driver lead does not couple to the voltage multiplexer output.

Figure 4:
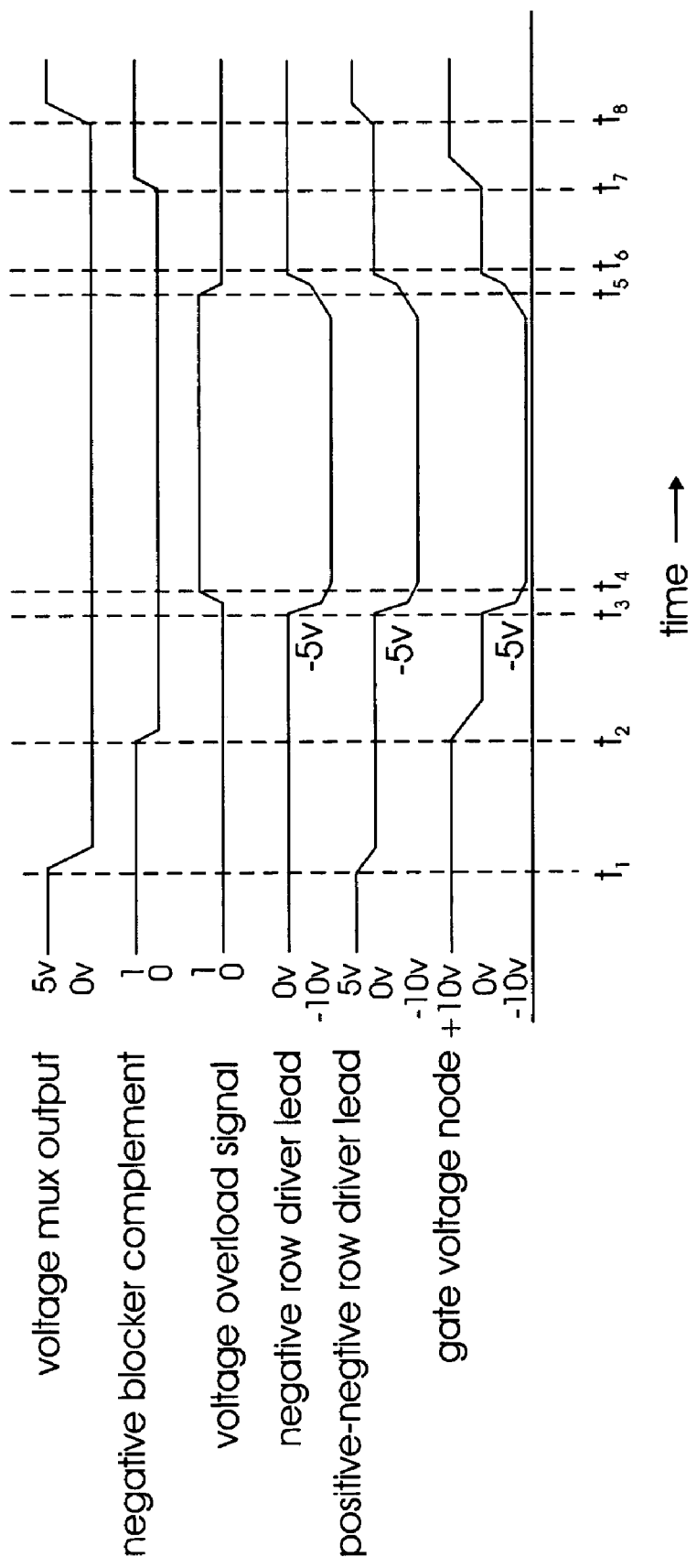
FIG. 4 is a timing diagram for various signals within the negative voltage blocking circuit of FIG. 3.

Operation of negative voltage blocking circuit 205 may be better understood with respect to the timing diagram of FIG. 4. The voltage levels discussed with regard to FIG. 4 are merely exemplary and depend upon the type of memory being implemented. In response to an erase instruction, the voltage multiplexer output is grounded along with the positive-negative row driver lead at a time $t_1$. At time $t_2$, the negative blocker complement signal is brought low, which causes high voltage switch 305 to ground its output voltage Vout such that the gate voltage node is also grounded. The negative row driver lead, the negative-positive row driver lead (and p-well bias) are then driven toward −10 V at time $t_3$. The default state of the voltage overload signal is ground such that the output of NOR gate 320 will go high at time $t_2$, which turns on transistor M2. Thus, as the negative row driver lead is pulled negative at time $t_3$, the gate voltage node will also be pulled negative. Because transistor M2 may be over-stressed if it remains conductive during the entire erasure operation, the voltage overload signal is asserted when the gate voltage node is approximately −6.0 V at time $t_4$. M2 will continue to conduct deposit the zero volts that results at its gate because its source is so negative at that time. After a pre-defined length of erase time such as 1 millisecond, the FLASH device enters an erase discharge period such that the output from the negative charge pump begins to head from −10 V to ground. In turn, the negative row driver lead is increased from −10 V at time $t_5$ due to the negative charge pump discharge. The gate voltage node will also increase such that the voltage overload signal may be de-asserted at approximately the same voltage threshold at time $t_6$. The negative row driver lead will then be grounded again so that the negative blocker complement signal may be asserted at time $t_7$. The gate voltage will then go to 10 V. Finally, the voltage multiplexer output may go to 5.0 V at time $t_8$, whereupon the positive-negative row driver lead may also increase to 5.0 V.

Embodiments described above illustrate but do not limit the invention. For example, it will be appreciated that a negative voltage blocking circuit may be implemented in any memory that accommodates negative voltage. It should also be understood that numerous modifications and variations are possible in accordance with the principles of the present invention. Moreover, no limitations from the specification are intended to be read into any claims unless those limitations are expressly included in the claims. Accordingly, the scope of the invention is defined by the following claims.

I claim:

1. A memory, comprising:
    a memory cell array adapted to be programmed with a positive voltage from a positive-negative node and to be erased with a negative voltage from the positive-negative node;
    a negative voltage blocking circuit; and
    a positive voltage source coupled to the negative voltage blocking circuit, the positive voltage source operable to provide the positive voltage to the positive-negative node through the negative voltage blocking circuit, wherein the negative voltage blocking circuit is adapted to prevent the negative voltage from coupling from the positive-negative node to the positive voltage source.

2. The memory of claim 1, wherein the memory cell array is a FLASH memory cell array.

3. The memory of claim 1, wherein the positive voltage source is a positive voltage charge pump.

4. The memory of claim 1, further comprising a negative voltage charge pump operable to provide the negative voltage to the positive-negative node.

5. The memory of claim 1, wherein the negative voltage blocking circuit comprises a transmission gate coupled between the positive voltage source and the positive-negative voltage node.

6. The memory of claim 5, wherein the memory cell array and an NMOS transistor in the transmission gate are all located within a triple p-well.

7. The memory of claim 6, wherein the positive voltage source and a PMOS transistor in the transmission gate are all located outside the triple p-well.

8. The memory of claim 6, wherein the positive-negative node and an inner p-well of the triple p-well are coupled during an erase operation in which the positive-negative node is driven with the negative voltage.

9. The memory of claim 7, further comprising a positive voltage switch operable to drive a gate of the PMOS transistor during a programming operation in which the positive-negative node is driven with the positive voltage.

10. The memory of claim 1, wherein the positive voltage is approximately positive 10 volts and the negative voltage is approximately negative 10 volts.

11. A method of operating an array of memory cells, comprising:
    driving a first set of cells within the array with a negative voltage, wherein the negative voltage couples from a negative voltage source through a positive-negative node to the first set of cells;
    driving a second set of cells within the array with a positive voltage, wherein the positive voltage couples from a positive voltage source through the positive-negative node to the second set of cells; and
    blocking the negative voltage from coupling to the positive voltage source while the first set of cells are driving with the negative voltage.

12. The method of claim 11, wherein the memory is a FLASH memory and the first set of cells are driven with the negative voltage so as to erase the first set of cells.

13. The method of claim 12, wherein the second set of cells are driven with the positive voltage so as to program the second set of cells.

14. The method of claim 11, wherein blocking the negative voltage comprises shutting off a transmission gate.

15. The method of claim 14, wherein shutting off the transmission gate comprises coupling the negative voltage to a gate of an NMOS transistor in the transmission gate.

16. The method of claim 15, wherein shutting off the transmission gate further comprises coupling the negative voltage to a p-well holding the NMOS transistor.

17. A programmable logic device, comprising:
    a logic core;
    a non-volatile memory for holding configuration data for the logic core;
    a positive voltage source operable to program the non-volatile memory with a positive voltage;
    a negative voltage source operable to erase the non-volatile memory with a negative voltage; and
    a blocking circuit operable to couple the positive voltage from the positive voltage source to the non-volatile memory and to isolate the positive voltage source from the negative voltage while the negative voltage source is operable to erase the non-volatile memory the negative voltage.

18. The programmable logic device of claim 17, wherein the non-volatile memory is a FLASH memory.

19. The programmable logic device of claim 17, wherein the blocking circuit comprises a transmission gate.

* * * * *

UNITED STATES PATENT AND TRADEMARK OFFICE
CERTIFICATE OF CORRECTION

PATENT NO. : 7,512,015 B1
APPLICATION NO. : 11/487751
DATED : March 31, 2009
INVENTOR(S) : Loren L. McLaury It is certified that error appears in the above-identified patent and that said Letters Patent is hereby corrected as shown below:

Col. 6, line 47-48 (Claim 17): change "to erase the non-volatile memory the negative voltage." to --to erase the non-volatile memory with the negative voltage.--

Signed and Sealed this

Sixteenth Day of March, 2010

David J. Kappos
*Director of the United States Patent and Trademark Office*